US010418257B1

(12) United States Patent
Murdock

(10) Patent No.: US 10,418,257 B1
(45) Date of Patent: Sep. 17, 2019

(54) ENVIRONMENTALLY ROBUST PLATING CONFIGURATION FOR METAL-DIAMOND COMPOSITES SUBSTRATE

(71) Applicant: Qorvo US, Inc., Greensboro, NC (US)

(72) Inventor: Dylan Murdock, Bend, OR (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/043,710

(22) Filed: Jul. 24, 2018

(51) Int. Cl.
*H01L 23/14* (2006.01)
*H01L 21/48* (2006.01)
*H01L 23/373* (2006.01)

(52) U.S. Cl.
CPC ........ *H01L 21/4871* (2013.01); *H01L 23/142* (2013.01); *H01L 23/3732* (2013.01); *H01L 23/3735* (2013.01)

(58) Field of Classification Search
CPC ............... H01L 21/4871; H01L 23/142; H01L 23/3732; H01L 23/3735
See application file for complete search history.

(56) References Cited

U.S. PATENT DOCUMENTS

| | | | |
|---|---|---|---|
| 2008/0298024 A1* | 12/2008 | Takashima | H01L 23/3732 361/718 |
| 2011/0044004 A1* | 2/2011 | Garosshen | H01L 23/3732 361/709 |
| 2012/0237791 A1* | 9/2012 | Lin | G06F 1/20 428/634 |
| 2016/0276242 A1* | 9/2016 | Trulli | H01L 23/34 |

* cited by examiner

*Primary Examiner* — Steven T Sawyer
(74) *Attorney, Agent, or Firm* — Withrow & Terranova, P.L.L.C.

(57) ABSTRACT

The present disclosure relates to a substrate with a plating configuration and a process for making the same. The disclosed substrate includes a substrate base with a substrate body, and a plating configuration with a plating seed layer and a plating barrier layer. Herein, the substrate body is formed of metal-diamond composites. The plating seed layer is formed of copper, silver, or gold, and the plating barrier layer includes nickel material. The plating seed layer directly covers at least sidewalls of the substrate body, and the plating barrier layer is directly formed over the plating seed layer and encloses the substrate base.

20 Claims, 11 Drawing Sheets

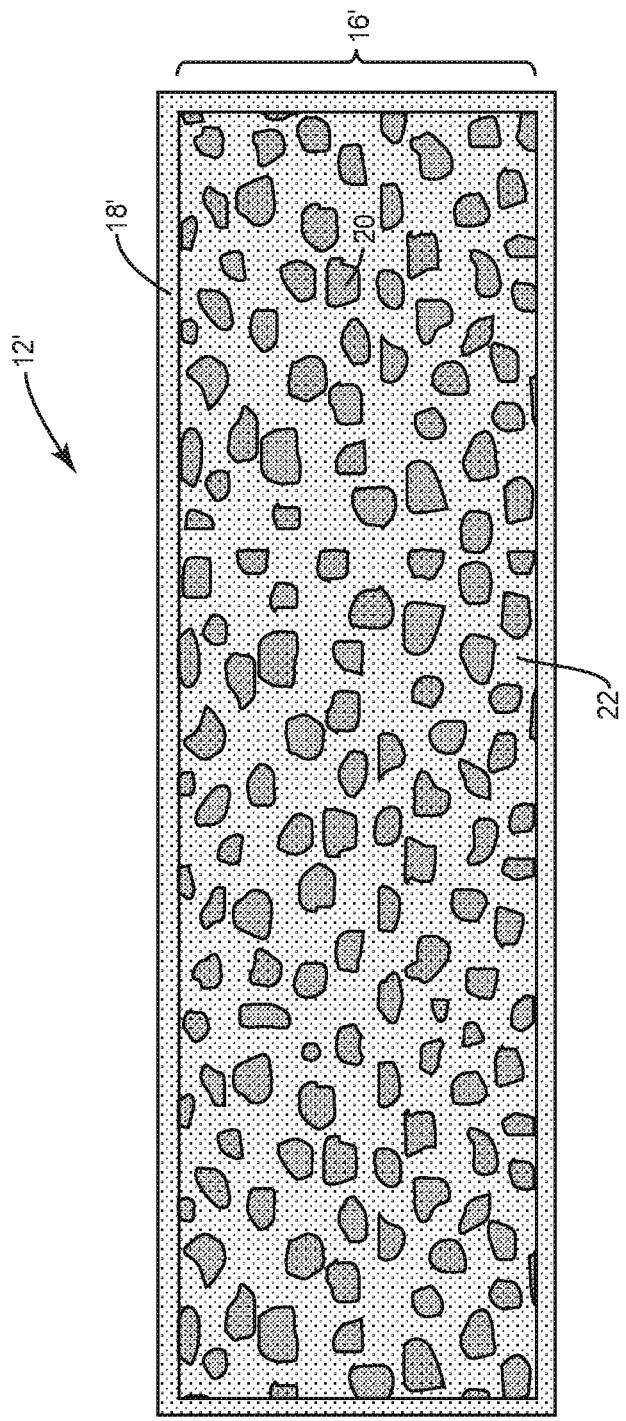

ENVIRONMENTALLY ROBUST PLATING CONFIGURATION FOR METAL-DIAMOND COMPOSITES SUBSTRATE

FIELD OF THE DISCLOSURE

The present disclosure relates to a substrate with a plating configuration and a process for making the same, and more particularly to a metal-diamond composites substrate with an environmentally robust plating configuration, and a process to apply the environmentally robust plating configuration.

BACKGROUND

With the current popularity of portable communication devices and developed semiconductor fabrication technology, high speed and high performance transistors are more densely integrated on semiconductor dies. The amount of heat generated by the semiconductor dies increases significantly due to the growth in number of transistors per semiconductor die, the growth of power passing through the transistors, and the growth of operation speed of the transistors. If the heat generated by the semiconductor dies cannot be dissipated efficiently, the semiconductor dies may fail to operate or have a degraded operating performance. Normally, semiconductor dies reside in or on a bulk substrate, and the bulk substrate can affect the semiconductor dies performance in many ways. For instance, the heat produced by the semiconductor dies could be conducted away from their immediate vicinity through the bulk substrate. Accordingly, metal-diamond composites, which have superior thermal conductivity, are introduced to form the bulk substrate. In addition, metal-diamond composites present advantages to semiconductor packaging in that the coefficient of thermal expansion (CTE) is within the acceptable region for use with semiconductor devices.

A major challenge with the metal-diamond composites is, after dicing the bulk substrate into individual substrates, at least the sidewalls of each substrate present surfaces including both electrically conductive metal and electrically non-conductive diamond. Therefore, electroless plating is the only option for protecting these sidewalls. Electroless nickel plating is a conventional technique used to deposit a coating of nickel on a substrate to prevent corrosion and wear. However, the electroless nickel plating is relatively brittle and has a relatively large CTE mismatch to the metal-diamond composites. The electroless nickel plating may crack during temperature cycle (between −65° C. and 150° C.), and may cause failure during corrosive environment exposure such as salt fog.

Accordingly, there remains a need for improved substrate designs, which could utilize the thermal advantages of the metal-diamond composites, and reduce the brittle and/or CTE mismatch disadvantages from the electroless nickel plating. The substrate designs will also preferably be low cost and use easily attainable materials.

SUMMARY

The present disclosure relates to a substrate with a plating configuration and a process for making the same. The disclosed substrate includes a substrate base and a plating configuration. The substrate base includes a substrate body that has an upper surface, a lower surface, and sidewalls. Herein, the substrate body is formed of metal-diamond composites, which include diamond particulates dispersed throughout the substrate body, and a metal filler filling gaps among the diamond particulates. The sidewalls of the substrate body present surfaces including both the diamond particulates and the metal filler. The plating configuration includes a plating seed layer and a plating barrier layer. Herein, the plating seed layer is formed of one of copper, silver, and gold, and the plating barrier layer includes nickel material. The plating seed layer directly covers at least the sidewalls of the substrate body. The plating barrier layer is formed directly over the plating seed layer and encloses the substrate base.

In one embodiment of the substrate, the substrate base further includes a first individual metal skin layer directly covering the upper surface of the substrate body and a second individual skin layer directly covering the lower surface of the substrate body.

In one embodiment of the substrate, the metal filler of the metal-diamond composites is aluminum, and the first individual metal skin layer and the second individual metal skin layer are formed of aluminum.

In one embodiment of the substrate, the metal filler of the metal-diamond composites is copper, and the first individual metal skin layer and the second individual metal skin layer are formed of copper.

In one embodiment of the substrate, the metal filler of the metal-diamond composites is silver, and the first individual metal skin layer and the second individual metal skin layer are formed of silver.

In one embodiment of the substrate, the plating seed layer encloses the substrate base, and is in contact with the first individual metal skin layer and the second individual metal skin layer.

In one embodiment of the substrate, the plating barrier layer is in contact with the first individual metal skin layer and the second individual metal skin layer.

In one embodiment of the substrate, the plating seed layer encloses the substrate base, and is in contact with the upper surface of the substrate body and the lower surface of the substrate body.

In one embodiment of the substrate, the plating configuration further includes a plating adhesion layer. The plating adhesion layer fully covers and is in contact with the plating barrier layer. The plating adhesion layer is formed of gold or silver.

In one embodiment of the substrate, the plating configuration further includes a plating adhesion layer. The plating adhesion layer covers and is in contact with a portion of the plating barrier layer. The plating adhesion layer is formed of gold or silver.

In one embodiment of the substrate, the plating barrier layer is formed of one of nickel, nickel-phosphorus alloy, and nickel-boron alloy.

According to an exemplary process, a number of substrate bases are provided. Herein, each substrate base includes a substrate body that has an upper surface, a lower surface, and sidewalls. The substrate body is formed of metal-diamond composites, which include diamond particulates dispersed throughout the substrate body, and a metal filler filling gaps among the diamond particulates. The sidewalls of the substrate body present surfaces including both the diamond particulates and the metal filler. Next, a plating configuration is applied to each substrate base. The plating configuration includes a plating seed layer and a plating barrier layer. The plating seed layer is formed of one of copper, silver, and gold, and the plating barrier layer includes nickel material. The plating seed layer directly covers at least the sidewalls of the substrate body. The plating barrier layer is formed directly over the plating seed layer and encloses a corresponding substrate base.

In one embodiment of the process, applying a plating configuration includes applying the plating seed layer to each substrate base and forming the plating barrier layer directly over the plating seed layer.

In one embodiment of the process, the plating seed layer is applied by electroless plating.

In one embodiment of the process, the plating barrier layer is formed of nickel by electrolytic plating.

In one embodiment of the process, the plating barrier layer is formed of nickel-phosphorus alloy or nickel-boron alloy by electroless plating.

In one embodiment of the process, applying a plating configuration further includes forming a plating adhesion layer directly over the plating barrier layer. Herein, the plating adhesion layer is formed of gold or silver. The plating adhesion layer is formed by electrolytic plating.

In one embodiment of the process, applying a plating configuration further includes forming a plating adhesion layer directly over the plating barrier layer. The plating adhesion layer is formed of gold or silver. The plating adhesion layer is formed by electroless plating.

In one embodiment of the process, each substrate base further includes a first individual metal skin layer directly covering the upper surface of the substrate body and a second individual skin layer directly covering the lower surface of the substrate body.

In one embodiment of the process, providing the number of substrate bases includes providing a bulk substrate body. The bulk substrate body is formed of the metal-diamond composites, which include the diamond particulates dispersed throughout the bulk substrate body, and the metal filler filling gaps among the diamond particulates. Next, a continuous metal skin layer is applied to the bulk substrate body to form a bulk substrate base. The continuous metal skin layer encloses and is in contact with each surface of the bulk substrate body. Finally, the bulk substrate base is diced into the number of individual substrate bases.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
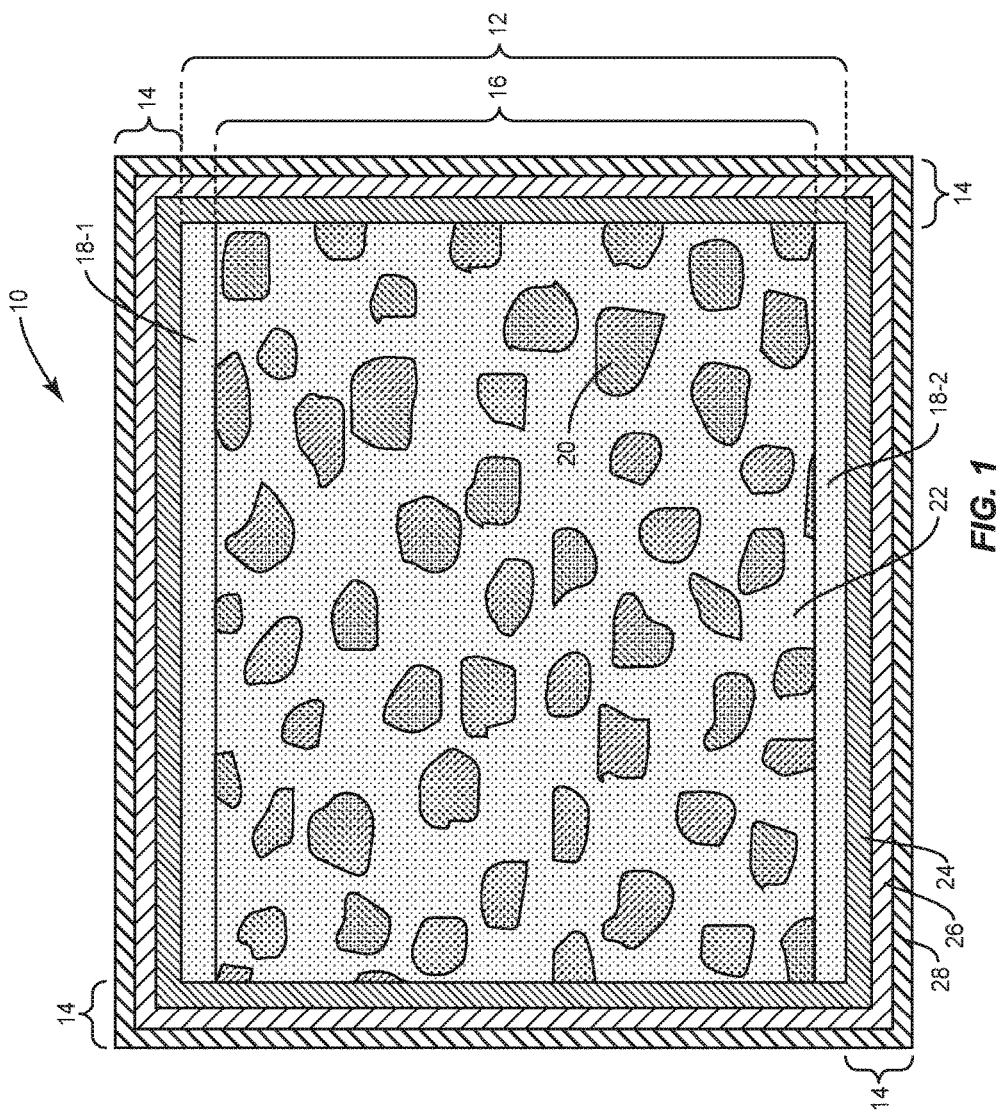
FIG. 1 illustrates an exemplary substrate with a plating configuration according to one embodiment of the present disclosure.
Figure 2:
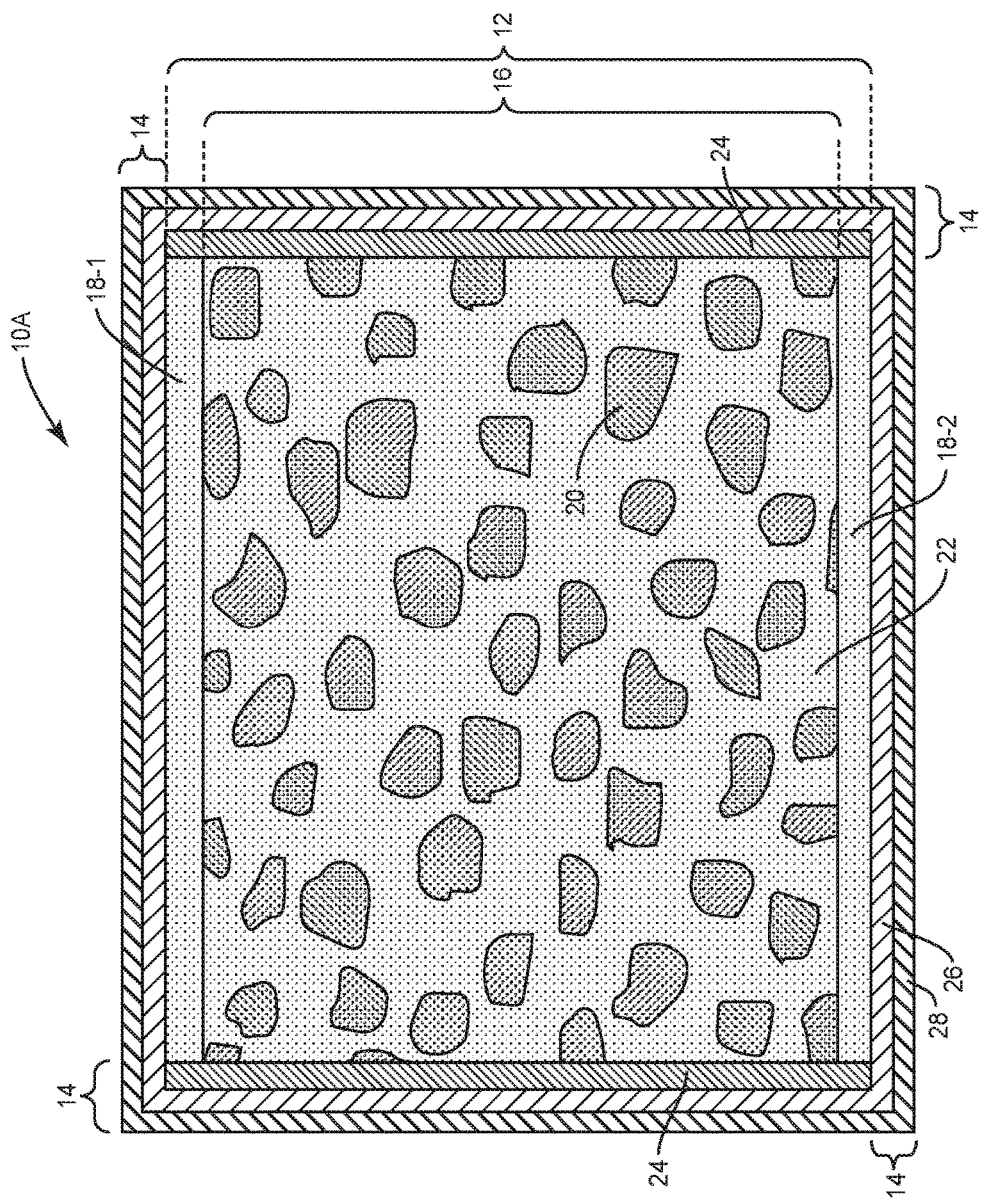
FIGS. 2-5 illustrate alternative substrates according to embodiments of the present disclosure.

FIGS. 6A-6F provide exemplary steps that illustrate a process to fabricate the exemplary substrate shown in FIG. 1.

It will be understood that for clear illustrations, FIGS. 1-6F may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a metal-diamond composites substrate with an environmentally robust plating configuration, and a process for making the same. FIG. 1 illustrates an exemplary substrate 10 according to one embodiment of the present disclosure. The substrate 10 includes a substrate base 12 and a plating configuration 14.

In detail, the substrate base 12 includes a substrate body 16 and individual metal skin layers 18. The substrate body 16 may be formed of metal-diamond composites, which include diamond particulates 20 (for simplification and clarity, only one diamond particulate is labeled with reference number) dispersed throughout the substrate body 16, and a metal filler 22 filling gaps among the diamond particulates 20 essentially without any air pockets or voids. The metal-diamond composites used for the substrate body 16 may be aluminum-diamond (AlDia) composite materials, copper-diamond (CuDia) composite materials, or silver-diamond (AgDia) composite materials, such that, the metal filler 22 may be aluminum, copper, or silver, respectively. Herein, sidewalls of the substrate body 12 may present surfaces including both the electrically non-conductive diamond particulates 20 and the electrically conductive metal filler 22.

The individual metal skin layers 18 include a first individual metal skin layer 18-1 directly covering an upper surface of the substrate body 16 and a second individual skin layer 18-2 directly covering a lower surface of the substrate body 16. The individual metal skin layers 18 provide smooth and conductive surfaces. If the metal-diamond composites used in the substrate body 16 are the AlDia composite materials, the individual metal skin layers 18 may be formed of aluminum. If the metal-diamond composites used in the substrate body 16 are the CuDia composite materials, the individual metal skin layers 18 may be formed of copper. If the metal-diamond composites used in the substrate body 16 are the AgDia composite materials, the individual metal skin layers 18 may be formed of silver.

The plating configuration 14 encloses the substrate base 12, and is in contact with the sidewalls of the substrate body 16 and the individual metal skin layers 18, which are directly over the upper and lower surfaces of the substrate body 16. The plating configuration 14 includes a plating seed layer 24, a plating barrier layer 26, and a plating adhesion layer 28. The plating seed layer 24 is an inner layer of the plating configuration 14 and encloses the substrate base 12. As such, the plating seed layer 24 is in contact with the sidewalls of the substrate body 16 (in contact with both the electrically non-conductive diamond particulates 20 and the electrically conductive metal filler 22) and the individual metal skin layers 18. The plating barrier layer 26 fully covers and is in contact with the plating seed layer 24. The plating adhesion layer 28 fully covers and is in contact with the plating barrier layer 26. The plating seed layer 24 may be formed of copper, silver, or gold with a thickness between 5 μin and 1500 μin. The plating barrier layer 26 may be formed of nickel, nickel-phosphorus alloy (where phosphorus is 1%-15%) or nickel-boron alloy (where boron is 1%-15%), with a thickness between 5 μin and 1500 μin. The plating adhesion layer 28 may be formed of gold or silver with a thickness between 5 μin and 500 μin.

FIGS. 2-5 provide alternative substrates according to different embodiments of the present disclosure. In a substrate 10A shown in FIG. 2, the plating seed layer 24 of the plating configuration 14 does not enclose the substrate base 12. Instead, the plating seed layer 24 only covers and is in contact with the sidewalls of the substrate base 16 (in contact with both the electrically non-conductive diamond particulates 20 and the electrically conductive metal filler 22), but does not cover the individual metal skin layers 18, which provide conductive surfaces. Herein, the plating barrier layer 26 is formed over the plating seed layer 24 and encloses the substrate base 12. The plating barrier layer 26 is in contact with the plating seed layer 24 and the individual metal skin layers 18. The plating adhesion layer 28 fully covers and is in contact with the plating barrier layer 26.

Figure 3:
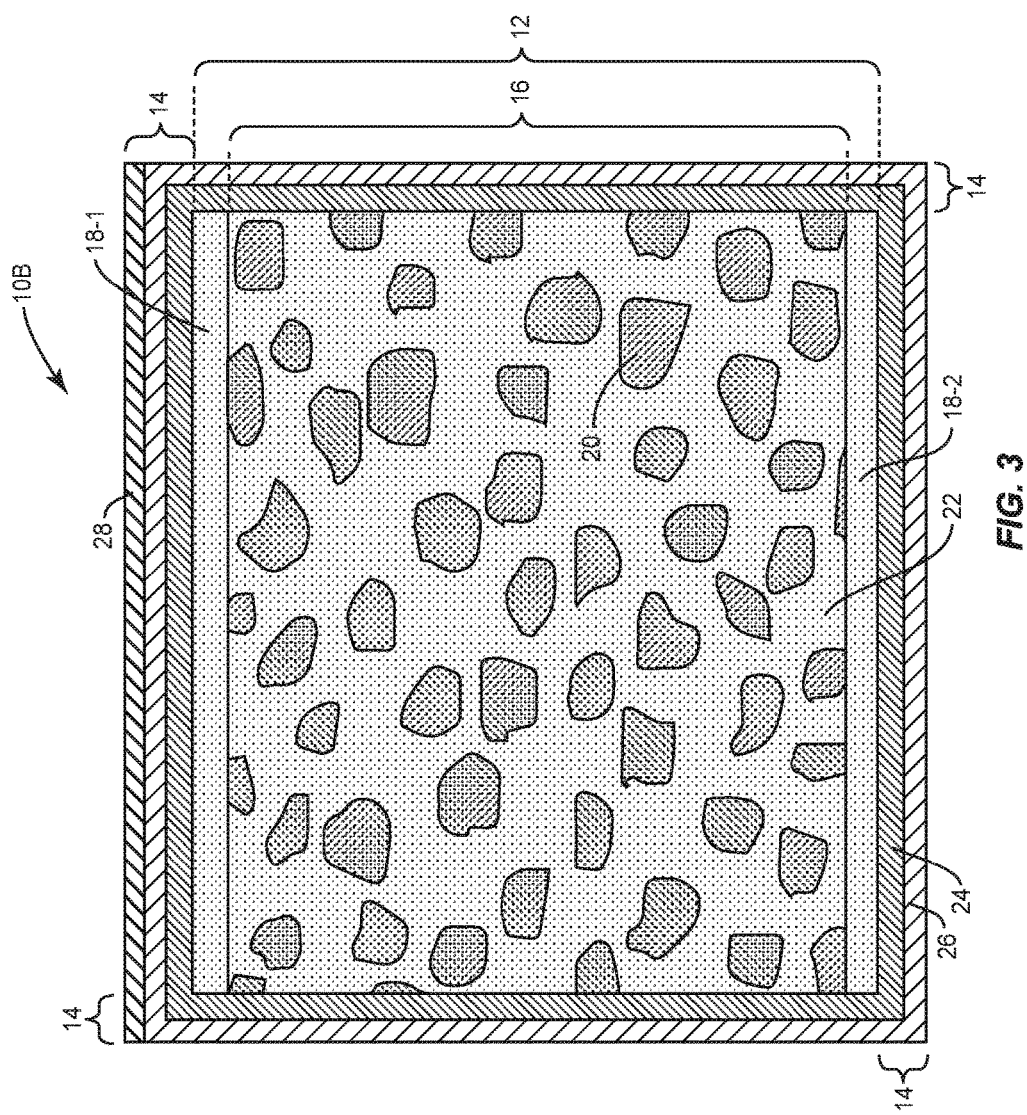
Figure 4:
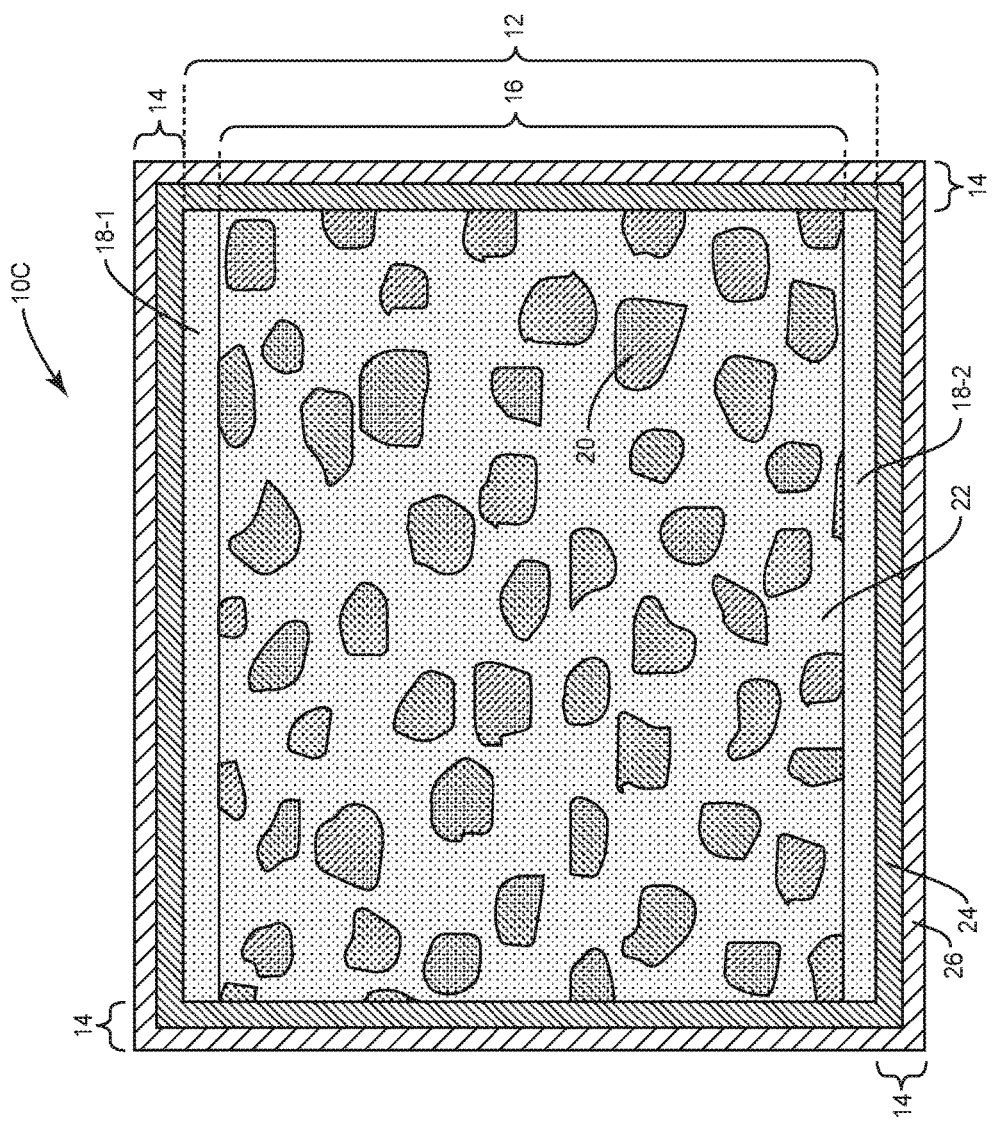

In a substrate 10B shown in FIG. 3, the plating adhesion layer 28 of the plating configuration 14 does not fully cover the plating barrier layer 26. In this embodiment, the plating seed layer 24 still encloses the substrate base 12, and is in contact with the sidewalls of the substrate body 16 (in contact with both the electrically non-conductive diamond particulates 20 and the electrically conductive metal filler 22) and the individual metal skin layers 18. The plating barrier layer 26 still fully covers and is in contact with the plating seed layer 24. However, the plating adhesion layer 28 only covers and is in contact with a portion of the plating barrier layer 26, where a semiconductor die (not shown) is arranged to be attached. Herein, the plating adhesion layer 28 resides over the upper surface of the substrate body 16. Further, in a substrate 10C shown in FIG. 4, the plating adhesion layer 28 of the plating configuration 14 is omitted. The plating configuration 14 only includes the plating seed layer 24 and the plating barrier layer 26. The plating seed layer 24 encloses the substrate base 12, and is in contact with the sidewalls of the substrate body 16 (in contact with both the electrically non-conductive diamond particulates 20 and the electrically conductive metal filler 22) and the individual metal skin layers 18. The plating barrier layer 26 fully covers and is in contact with the plating seed layer 24.

Figure 5:
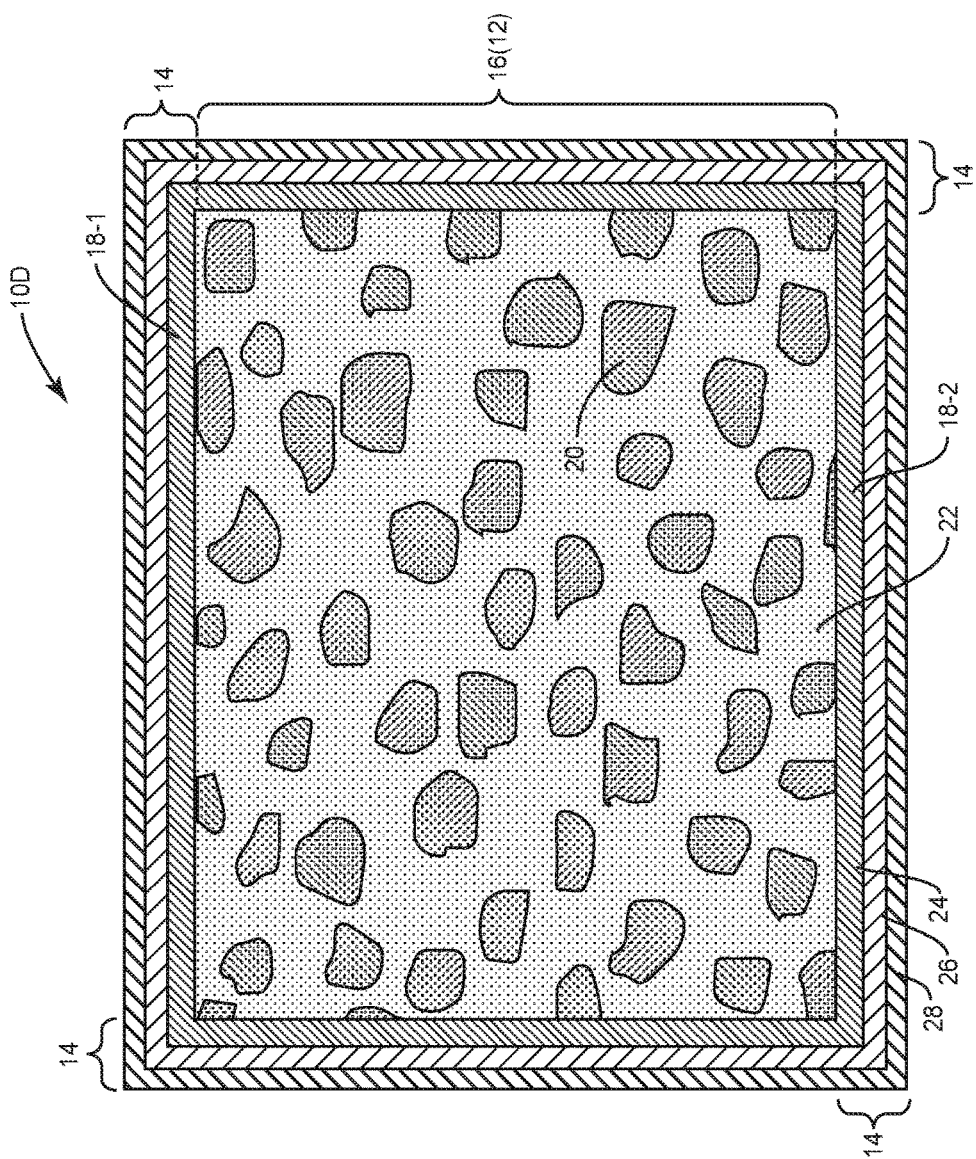

In another embodiment, a substrate 10D does not include any individual metal skin layer 18 (the substrate base 12 is the same as the substrate body 16), as illustrated in FIG. 5. Herein, the plating seed layer 24 fully covers and is in contact with each surface (the upper surface, the lower surface, and the side walls) of the substrate body 16. As such, the plating seed layer 24 may be in contact with both the electrically non-conductive diamond particulates 20 and the electrically conductive metal filler 22 at each surface of the substrate body 16. The plating barrier layer 26 fully covers and is in contact with the plating seed layer 24. The plating adhesion layer 28 fully covers and is in contact with the plating barrier layer 26.

FIGS. 6A-6F provide exemplary steps that illustrate a process to fabricate the exemplary substrate 10 shown in FIG. 1. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 6A-6F.

Figure 6A:
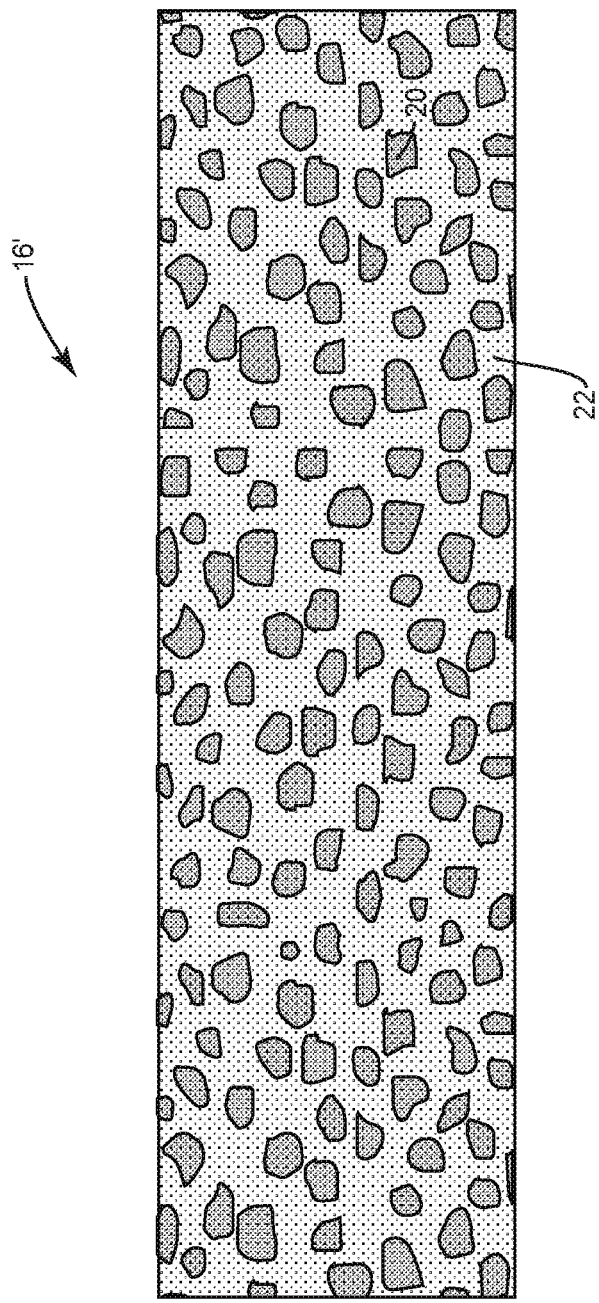

Initially, a bulk substrate body 16' is provided as depicted in FIG. 6A. The bulk substrate body 16' may be formed of the metal-diamond composites, which include the diamond particulates 20 (for simplification and clarity, only one diamond particulate is labeled with a reference number) dispersed throughout the bulk substrate body 16', and the metal filler 22 filling gaps among the diamond particulates 20 essentially without any air pockets or voids. The metal-diamond composites used in the bulk substrate body 16' may be the AlDia composite materials, the CuDia composite materials, or the AgDia composite materials, such that the metal filler 22 may be aluminum, copper, or silver, respectively.

Next, a continuous metal skin layer 18' is applied to the bulk substrate body 16' to form a bulk substrate base 12', as depicted in FIG. 6B. The continuous metal skin layer 18' fully covers and is in contact with each surface of the bulk substrate body 16' and provides a smooth and continuous surface of the bulk substrate base 12' for a following plating process. If the metal-diamond composites used in the bulk substrate body 16' are the AlDia composite materials, the continuous metal skin layer 18' may be formed of aluminum. If the metal-diamond composites used in the bulk substrate body 16' are the CuDia composite materials, the continuous metal skin layer 18' may be formed of copper. If the metal-diamond composites used in the bulk substrate body 16' are the AgDia composite materials, the continuous metal skin layer 18' may be formed of silver.

Figure 6C:
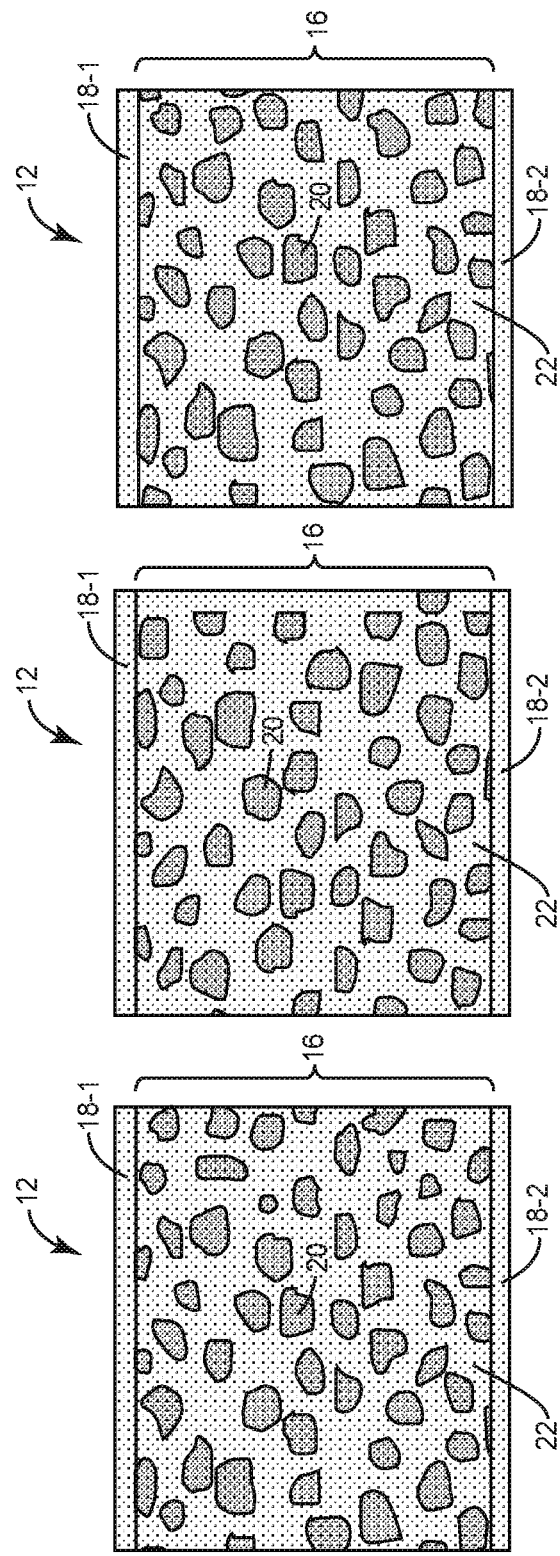

The bulk substrate base 12' is then diced into the individual substrate bases 12, as depicted in FIG. 6C. Each substrate base 12 includes the substrate body 16 and the individual metal skin layers 18. The first individual metal skin layer 18-1 directly covers the upper surface of the substrate body 16 and the second individual skin layer 18-2 directly covers the lower surface of the substrate body 16. Herein, the sidewalls of the substrate body 16, which include both the electrically non-conductive diamond particulates 20 and the electrically conductive metal filler 22, are exposed.

Figure 6D:
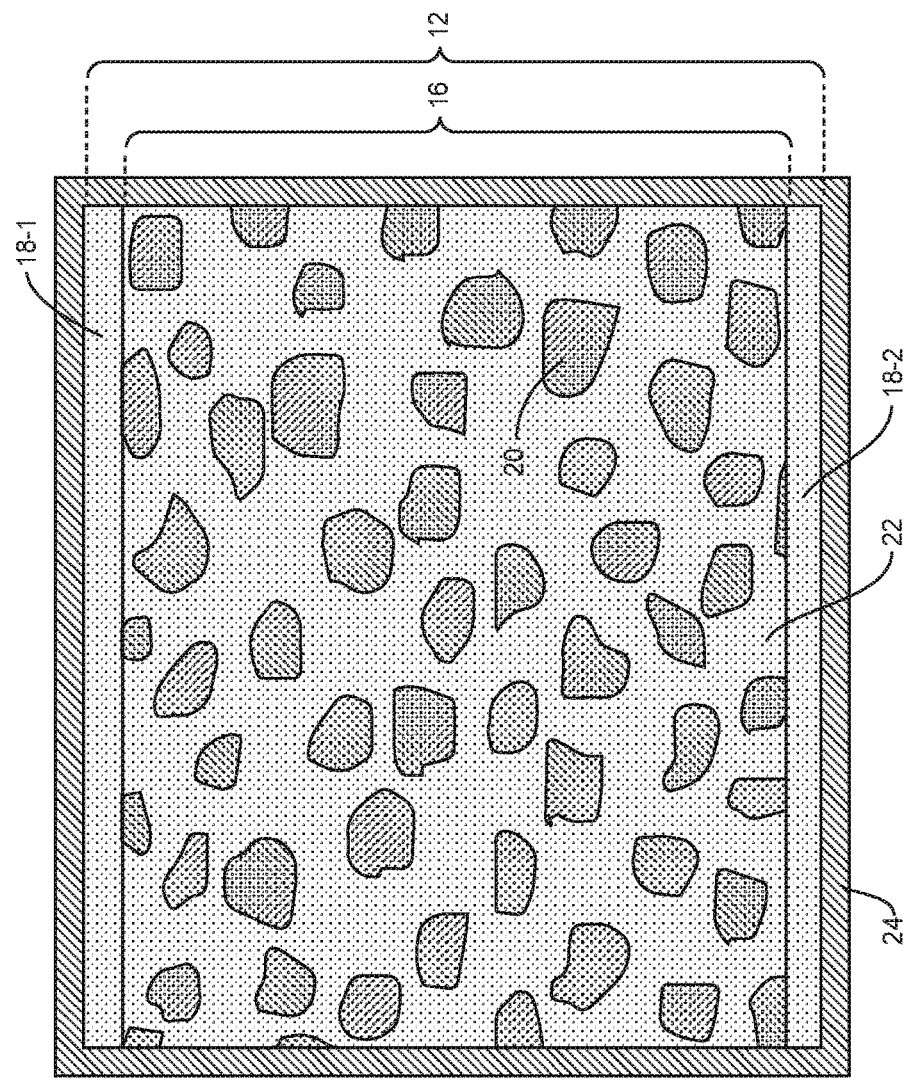
Figure 6E:
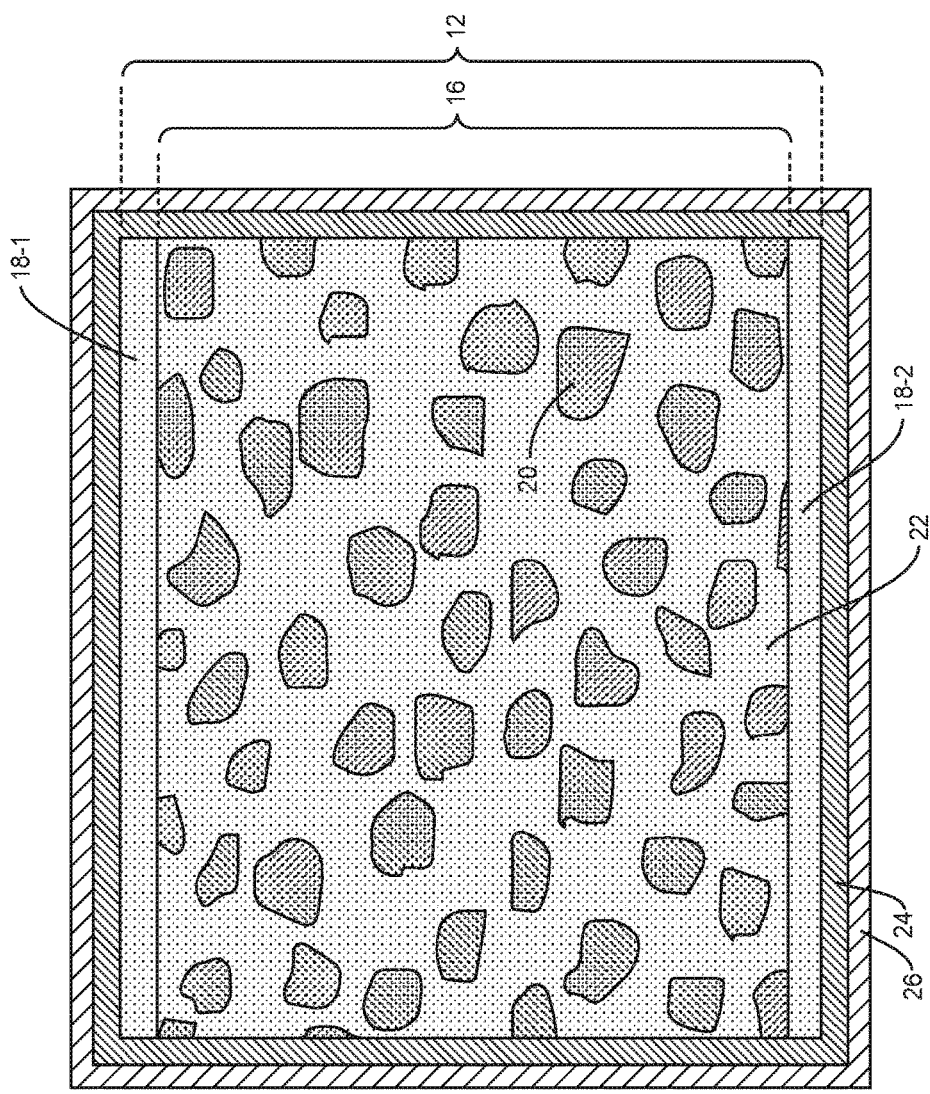
Figure 6F:
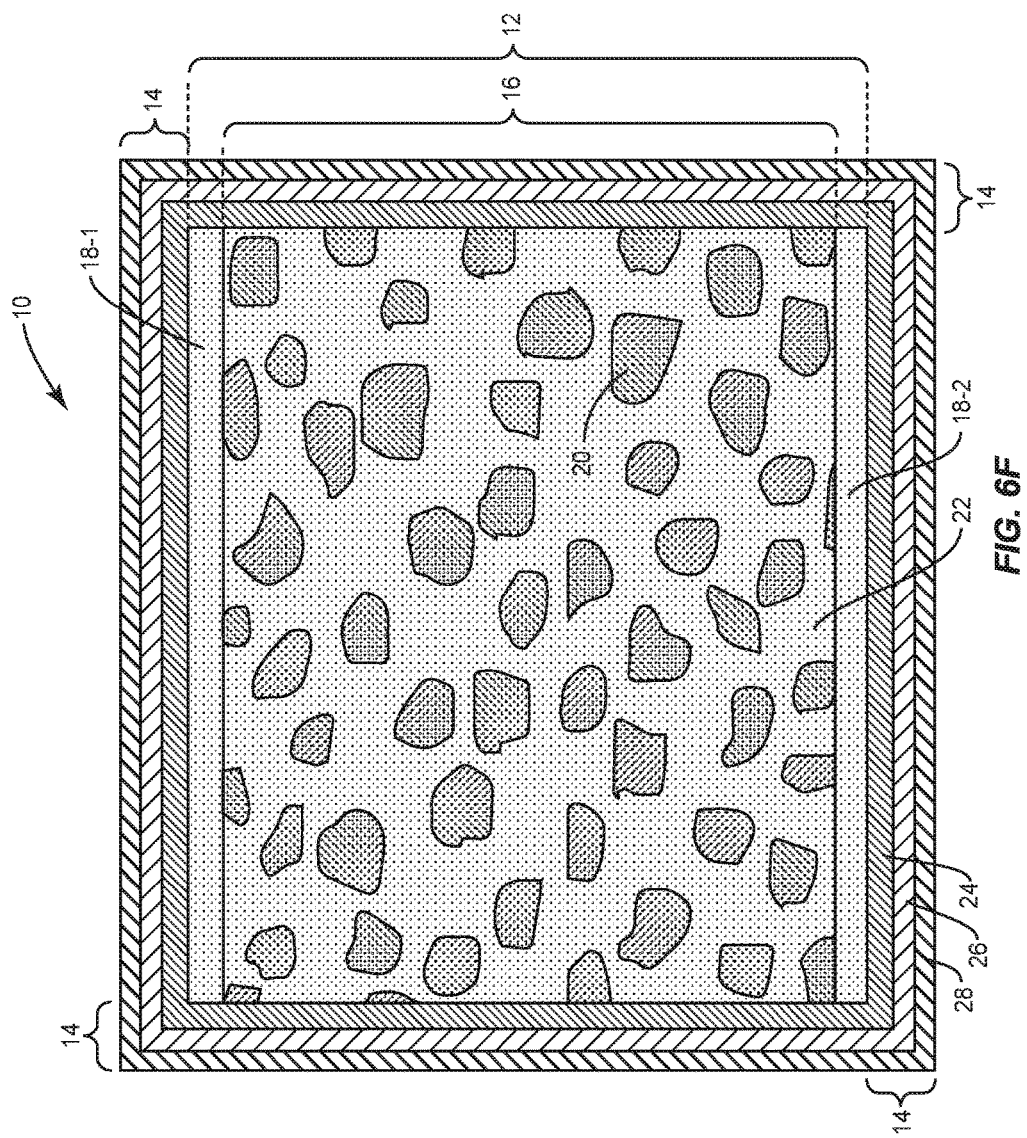

With reference to FIGS. 6D through 6F, the plating configuration 14 is formed to complete the substrate 10 according to one embodiment of the present disclosure. The plating seed layer 24 is firstly formed to enclose the substrate base 12 as depicted in FIG. 6D. Herein, the plating seed layer 24 may be formed of copper, silver, or gold, and is in contact with the sidewalls of the substrate body 16 and the individual metal skin layers 18. Since the sidewalls of the substrate body 16 present surfaces including both the electrically non-conductive diamond particulates 20 and the electrically conductive metal filler 22, the plating seed layer 24 is formed by electroless plating. The plating seed layer 24 formed of copper/silver/gold by the electroless plating is more ductile than conventional electroless nickel plating, and will not crack during temperature cycle (between −65° C. and 150° C., or between −65° C. and 350° C.).

Next, the plating barrier layer 26 is applied over the plating seed layer 24, as depicted in FIG. 6E. Herein, the plating barrier layer 26 fully covers and is in contact with the plating seed layer 24. Since the plating seed layer 24 provides a fully conductive surface (electrically non-conductive diamond particulates 20 are not exposed), the plating barrier layer 26 may be formed by either electroless plating or electrolytic plating. If the plating barrier layer 26 is formed by the electrolytic plating, the plating barrier layer 26 may be formed of essentially pure nickel. If the plating barrier layer 26 is formed by the electroless plating, the plating barrier layer 26 may be formed of nickel-phosphorus alloy or nickel-boron alloy. It is clear to those skilled in the art that the plating barrier layer 26 formed by the electrolytic plating may be more ductile than the plating barrier layer 26 formed by the electroless plating.

Finally, the plating adhesion layer 28 is applied over the plating barrier layer 26, as depicted in FIG. 6F. Herein, the plating adhesion layer 28 fully covers and is in contact with the plating barrier layer 26. The plating adhesion layer 28 may be formed of gold or silver. Since the plating barrier layer 26 provides a fully conductive surface (electrically non-conductive diamond particulates 20 are not exposed), the plating adhesion layer 28 may be formed by either electroless plating or electrolytic plating.

Those skilled in the art will recognize improvements and modifications to the preferred embodiments of the present disclosure. All such improvements and modifications are considered within the scope of the concepts disclosed herein and the claims that follow.

What is claimed is:

1. A substrate comprising:
   a substrate base comprising a substrate body that has an upper surface, a lower surface, and sidewalls, wherein:
      the substrate body is formed of metal-diamond composites, which include diamond particulates dispersed throughout the substrate body, and a metal filler filling gaps among the diamond particulates; and
      the sidewalls of the substrate body present surfaces including both the diamond particulates and the metal filler; and
   a plating configuration comprising a plating seed layer and a plating barrier layer, wherein:
      the plating seed layer is formed of one of a group consisting of copper, silver, and gold;
      the plating barrier layer comprises nickel;
      the plating seed layer directly covers at least the sidewalls of the substrate body, such that the plating seed layer is in contact with both the diamond particulates and the metal filler; and
      the plating barrier layer is formed directly over the plating seed layer and encloses the substrate base.

2. The substrate of claim 1 wherein the substrate base further comprises a first individual metal skin layer directly covering the upper surface of the substrate body and a second individual metal skin layer directly covering the lower surface of the substrate body, wherein the first individual metal skin layer and the second individual metal skin layer do not extend over the sidewalls of the substrate body.

3. The substrate of claim 2 wherein the metal filler of the metal-diamond composites is aluminum, and the first individual metal skin layer and the second individual metal skin layer are formed of aluminum.

4. The substrate of claim 2 wherein the metal filler of the metal-diamond composites is copper, and the first individual metal skin layer and the second individual metal skin layer are formed of copper.

5. The substrate of claim 2 wherein the metal filler of the metal-diamond composites is silver, and the first individual metal skin layer and the second individual metal skin layer are formed of silver.

6. The substrate of claim 2 wherein the plating seed layer encloses the substrate base, and is in contact with the first individual metal skin layer and the second individual metal skin layer.

7. The substrate of claim 2 wherein the plating barrier layer is in contact with the first individual metal skin layer and the second individual metal skin layer.

8. The substrate of claim 1 wherein the plating seed layer encloses the substrate base, and is in contact with the upper surface of the substrate body and the lower surface of the substrate body.

9. The substrate of claim 1 wherein the plating configuration further comprises a plating adhesion layer, wherein:
   the plating adhesion layer encloses and is in contact with the plating barrier layer; and
   the plating adhesion layer is formed of gold or silver.

10. The substrate of claim 1 wherein the plating configuration further comprises a plating adhesion layer, wherein:

the plating adhesion layer covers and is in contact with a portion of the plating barrier layer; and the plating adhesion layer is formed of gold or silver.

11. The substrate of claim 1 wherein the plating barrier layer is formed of one of a group consisting of nickel, nickel-phosphorus alloy, and nickel-boron alloy.

12. A method comprising:
providing a plurality of substrate bases, wherein:
each of the plurality of substrate bases comprises a substrate body that has an upper surface, a lower surface, and sidewalls
the substrate body is formed of metal-diamond composites, which include diamond particulates dispersed throughout the substrate body, and a metal filler filling gaps among the diamond particulates; and
the sidewalls of the substrate body present surfaces including both the diamond particulates and the metal filler; and
applying a plating configuration to each of the plurality of substrate bases, wherein,
the plating configuration comprises a plating seed layer and a plating barrier layer;
the plating seed layer is formed of one of a group consisting of copper, silver, and gold;
the plating barrier layer comprises nickel;
the plating seed layer directly covers at least the sidewalls of the substrate body such that the plating seed layer is in contact with both the diamond particulates and the metal filler; and
the plating barrier layer is directly formed over the plating seed layer and encloses a corresponding substrate base.

13. The method of claim 12 wherein applying the plating configuration comprises:
applying the plating seed layer to each of the plurality of substrate bases; and
forming the plating barrier layer directly over the plating seed layer.

14. The method of claim 13 wherein the plating seed layer is applied by electroless plating.

15. The method of claim 13 wherein the plating barrier layer is formed of nickel by electrolytic plating.

16. The method of claim 13 wherein the plating barrier layer is formed of nickel-phosphorus alloy or nickel-boron alloy by electroless plating.

17. The method of claim 13 wherein applying the plating configuration further comprises forming a plating adhesion layer directly over the plating barrier layer, wherein:
the plating adhesion layer is formed of gold or silver; and
the plating adhesion layer is formed by electrolytic plating.

18. The method of claim 13 wherein applying the plating configuration further comprises forming a plating adhesion layer directly over the plating barrier layer, wherein:
the plating adhesion layer is formed of gold or silver; and
the plating adhesion layer is formed by electroless plating.

19. The method of claim 12 wherein each of the plurality of substrate bases further comprises a first individual metal skin layer directly covering the upper surface of the substrate body and a second individual metal skin layer directly covering the lower surface of the substrate body, wherein the first individual metal skin layer and the second individual metal skin layer do not extend over the sidewalls of the substrate body.

20. The method of claim 19 wherein providing the plurality of substrate bases comprises:
providing a bulk substrate body, wherein the bulk substrate body is formed of the metal-diamond composites, which include the diamond particulates dispersed throughout the bulk substrate body, and the metal filler filling gaps among the diamond particulates;
applying a continuous metal skin layer to the bulk substrate body to form a bulk substrate base, wherein the continuous metal skin layer encloses and is in contact with each surface of the bulk substrate body; and
dicing the bulk substrate base into the plurality of individual substrate bases.

* * * * *